Dec. 17, 1963

S. R. HOFSTEIN

THYRISTOR RECEIVER

Filed Nov. 1, 1960

3,114,882

INVENTOR.
Steven R. Hofstein
BY
Morris A. Rabkin
ATTORNEY

United States Patent Office 3,114,882

Patented Dec. 17, 1963

3,114,882

THYRISTOR RECEIVER

Steven R. Hofstein, Princeton, N.J., assignor to Radio Corporation of America, a corporation of Delaware Filed Nov. 1, 1960, Ser. No. 66,449
6 Claims. (Cl. 325—491)

This invention relates generally to radio receivers, and more particularly to improved receivers employing thyristors in a novel, signal-translating manner. The thyristor receivers of the present invention are particularly useful in the field of radio communications as highly sensitive receivers, and in the field of "radio control" as means for providing a relatively strong output signal to some electro-mechanical device upon the receipt of a relatively weak command signal.

The term "thyristor," as used herein, designates a three-electrode, semiconductod device that may be operated bistably, either in a first mode of operation, as a conventional transistor, or in a second mode of operation, as a highly conductive switch. The mode of operation depends upon whether the current flowing through the collector electrode of the thyristor is below or above a critical amplitude. The thyristor has thyratron-like characteristics that closely approach those of an ideal switch. The thyristor, unlike the thyratron, however, can be turned off readily by a suitable voltage on a control electrode. The bistable operation of the thyristor results from the construction of the semiconductor collector contact that collects holes at low current densities and injects electrons at high current densities. A detailed description of the construction and characteristics of the thyristor is given in an article, "The Thyristor—a New High-Speed Switching Transistor," by C. W. Mueller and J. Hilibrand, in The IRE Transactions of the Professional Group on Electron Devices, January 1958.

Many radio receivers employing semiconductor devices, such as transistors, require a few stages of amplification to translate a relatively weak input signal into a suitable output signal for either communication or control purposes. Consequently, the need for a number of amplifier stages, when semiconductors are used, and the need for filament heating means and relatively high voltages, when tubes are used, cause prior art radio receivers to be relatively bulky and heavy, and to consume relatively high stand-by power. This is especially true of prior art radio receivers used in the "radio-control" field.

Accordingly, it is an object of the present invention to provide a novel thyristor receiver that is adapted to translate a relatively weak input signal into an output signal of sufficient power to operate electro-mechanical and other, high power, output devices with fewer stages of amplification than needed by prior art transistor receivers.

Another object of the present invention is to provide a novel thyristor receiver that is relatively small in size and light in weight, has a relatively high input sensitivity, and requires relatively low stand-by power in comparison to many prior art receivers.

Still another object of the present invention is to provide a novel thyristor receiver that is relatively simple in structure and circuitry, reliable in operation, and highly efficient in use.

In accordance with the present invention, the novel thyristor receiver comprises a thyristor having emitter, base, and collector electrodes. The thyristor is connected in a circuit providing a regenerative feedback of energy between two of its electrodes. In a preferred embodiment, the thyristor is connected in a common-emitter configuration, having an input network connected between the emitter and base electrodes and an output network connected between the emitter and collector electrodes. The input network comprises an adjustable, tuned network. The output network is regeneratively coupled to the input network to transfer energy from the output to the input so that the circuit will oscillate under certain conditions of operation. Adjustable means are provided to vary the bias on the base electrode so that the circuit may be adjusted to operate either (1) just below the point of oscillation, (2) for sustained oscillations, or (3) for oscillations of an amplitude whose peak current exceeds the critical, breakover value at which the thyristor switches from its first (transistor) mode of operation to its second (high conductance) mode of operation. Means comprising a resistor-capacitor network are provided to cause the thyristor to switch periodically from its second mode of operation to its first mode of operation when the current through the collector electrode exceeds the critical, breakover amplitude.

The thyristor receiver may be operated irreversibly after responding to a relatively weak, input signal and providing an output signal to operate an output device, such as a relay. For this mode of operation, the base electrode of the thyristor is biased so that the circuit is just below the point of oscillation. Due to the significant, nonlinear amplification characteristic of the thyristor, the presence of an input signal of sufficient amplitude will cause the circuit to trigger into self-sustained oscillations. The oscillations can then cause the collector current to exceed the critical breakover amplitude, and, in the absence of the aforementioned resistor-capacitor network, sufficient current will flow in the output network to operate a relay. The relay can now actuate a local "work" circuit to perform any desired function.

To operate the novel thyristor receiver as a communications receiver, the base electrode is biased so that the circuit oscillates at a desired carrier frequency, and the thyristor is caused to switch from its first mode of operation to its second mode of operation periodically at a frequency preferably above the audio frequency range. Audio modulated carrier signals coupled to the tuning network will produce an amplified audio signal in an audio output device connected in the output network. When the modulation of the input carrier signal is at a substantially constant frequency, a frequency sensitive relay, such as a reed relay, in the output network of the circuit can be actuated.

The novel features of the present invention, both as to its organization and methods of operation, as well as additional objects and advantages thereof, will be more readily understood from the following description, when read in connection with the accompanying drawing, in which similar reference characters designate similar parts throughout, and in which.

Figure 1:
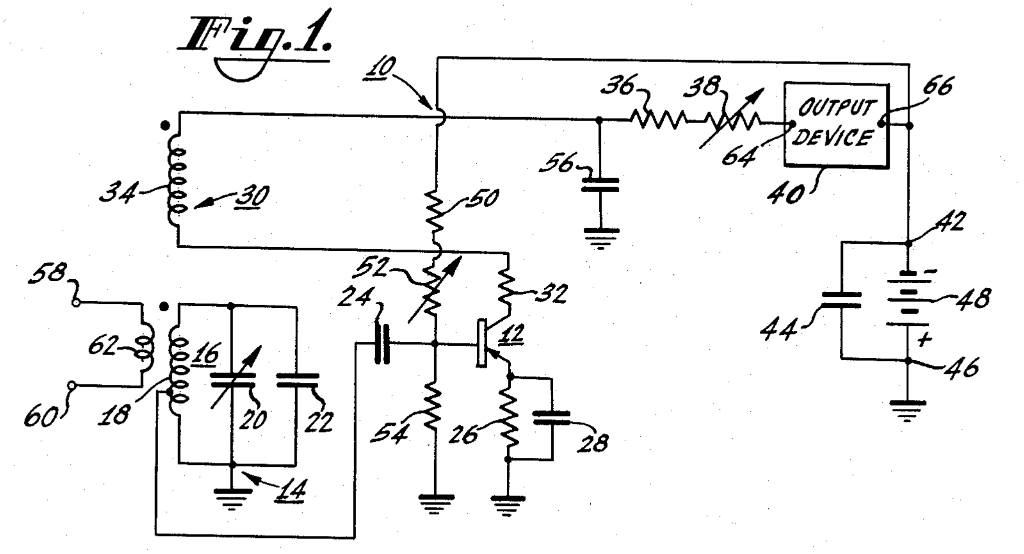
FIG. 1 is a schematic diagram of a thyristor receiver in accordance with the present invention.

Referring now particularly to FIG. 1, there is shown a thyristor receiver circuit 10 comprising a thyristor 12 connected in a common-emitter configuration. An input network 14 is connected between the base and the emitter of the thyristor 12. The input network 14 comprises a tuned network 16 having an inductor 18 and capacitors 20 and 22, each connected in parallel with the inductor 18. The capacitor 20 is variable so as to tune the tuning network 16 over a desired range of frequencies. One end of the inductor 18 is connected to a common connection, such as ground, and a tap on the inductor 18 is connected to the base electrode of the thyristor 12 through a coupling capacitor 24. The emitter of the thyristor 12 is connected to the common connection through a biasing resistor 26. The resistor 26 is shunted by a by-pass capacitor 28. Thus, the input network 14 between the base and the emitter of the thyristor 12 comprises the capacitor 24, the tuned network 16, and the bias resistor 26 shunted by the capacitor 28.

An output network 30 is connected between the collector and the emitter of the thyristor 12. The output network 30 comprises the following components connected serially between the collector of the thyristor 12 and the common connection, in the order named: a protective resistor 32, an inductor 34, a resistor 36, a variable resistor 38, an output device 40, and a capacitor 44 between a terminal 42 and a terminal 46. The resistor 32 may be dispensed with (replaced by a direct connection) if the surge current in the output network 30 does not become excessive under adjusted conditions of circuit operation.

The inductor 34 is inductively coupled to the inductor 18 to form regenerative, that is, positive, feed-back means therewith. The terminals 42 and 46 comprise means for applying a source of operating voltage, such as a battery 48, to the circuit 10. The positive terminal of the battery is connected to the common connection. It will be noted that the output network 30 and the input network 14 both share the resistor 26 and the capacitor 28 in common.

Variable means are provided to bias the base of the thyristor 12 so as to operate the circuit 10 is several methods of operation. To this end, a voltage divider comprising serially connected resistors 50, 52, and 54 is connected between the terminal 42 and the common connection. The resistor 52 is variable and has one end connected to the base of the thyristor 12.

A capacitor 56 is connected between the common connection and the junction between the inductor 34 and the resistor 36. The capacitor 56 forms a resistor-capacitor network with the resistors 36 and 38 for a purpose hereinafter appearing.

Input signals to the circuit 10 may be applied between input terminals 58 and 60. An inductor 62 is connected between the input terminals 58 and 60 and is inductively coupled to the tuning network 16.

Figure 3:
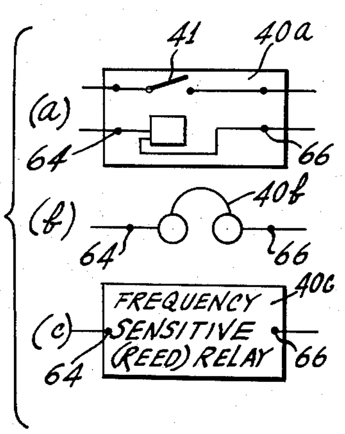
FIGS. 3(*a*), (*b*), and (*c*) are schematic diagrams of some output devices that may be used for the output device illustrated in the thyristor receiver of FIG. 1.

The output device 40 is connected between terminals 64 and 66 in the output network 30. The output device 40 may comprise a relay 40*a*, a sound transducer, such as head phones 40*b*, or a frequency sensitive (reed) relay 40*c*, for example, as shown in FIGS. 3(*a*), (*b*), and (*c*), respectively, depending upon the desired method of operating the circuit 10.

The operation of the circuit 10 as a radio receiver will now be described. Modulated carrier signals, as from an antenna system (not shown), are applied between the input terminals 58 and 60. The variable resistor 52 is adjusted so that a forward bias is applied to the thyristor 12. Current now flows in the output network 30, and energy is coupled to the input network 14 by the inductively coupled inductors 34 and 18. The forward bias on the base of the thyristor 12 is adjusted so that the thyristor amplification (and, hence, feedback) is sufficient to cause the circuit 10 to oscillate. The feedback energy increases with the bias current due to the non-linear amplification characteristic of the thyristor. The frequency of oscillations is determined by the tuning network 16, and the capacitor 20 is adjusted to tune the network 16 to the frequency of the carrier of the input signal. The amplitude of oscillations is adjusted by the variable resistor 52 so that the amplitude of the collector current of the thyristor exceeds the critical, breakover value. When this happens, the thyristor 12 switches its mode of operation from that as a high frequency transistor to that as a high conductance switch.

In its high conductance mode of operation, the thyristor 12 functions similarly to a thyratron that has been triggered "on," and a large amount of current flows in the output network 30. The capacitor 56 discharges through the thyristor 12 as soon as the collector current exceeds the critical breakover value. After the capacitor 56 has been discharged, the resistors 36 and 38 limit the current, and the thyristor 12 switches to its first mode of operation, that is, to its transistor mode. The capacitor 56 then recharges through the resistors 36 and 38, thereby reestablishing the original bias condition. The circuit 10 now begins to oscillate once more. The oscillations increase in amplitude until the amplitude of the collector current again exceeds the critical breakover value, and the cycle is repeated.

Figure 2:
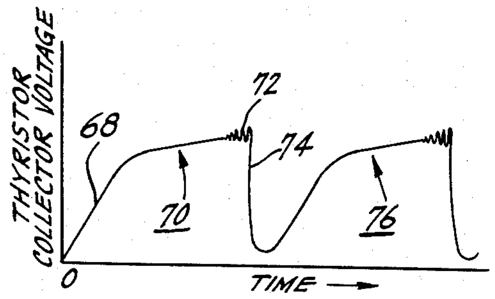
FIG. 2 is a graph of waveforms used to explain the operation of the thyristor receiver of FIG. 1.

Referring, now, to FIG. 2, there is shown a graph of the voltage at the collector of the thyristor 12 with respect to time. As current flows through the resistors 36 and 38, charging the capacitor 56, the voltage at the thyristor collector rises, as shown by the portion 68 of the waveform 70. When conditions are such that energy feed-back from the output network 30 to the input network 14 exceeds a certain amount, the circuit begins to oscillate. The resistance value of the resistor 32 may be so chosen such that the oscillations build up until the amplitude of the current through the collector exceeds the critical, breakover value. The oscillations are indicated by the portions 72 of the waveform 70. When the thyristor 12 breaks over from its oscillatory state to its high conductance state, the voltage across the thyristor decreases markedly, as shown by the portion 74 of the waveform 70.

After the capacitor 56 has discharged, the resistance provided by the resistors 32, 36 and 38 limits the current to a value that is less than that required to sustain the thyristor 12 in its high conductance state. Thus, the thyristor 12 switches to its first mode of operation and begins to function as a transistor. The cycle then repeats itself, as indicated by the waveform 76. In a typical case, the frequency of oscillations of the circuit 10, as indicated by the portion 72 of the waveform 70, may be in the order of 20 megacycles per second. The breakover frequency is a function of the resistor-capacitor network comprising the capacitor 56 and the resistors 36 and 38 and may be in the order of 30 kilocycles per second (above the audio range).

In the absence of an input signal to the circuit 10, the breakover frequency is also a function of the random noise of the thyristor 12. In the presence of a carrier frequency, the breakover, or quenching, frequency is stabilized and regular. A modulated carrier input signal provides an output signal whose quenching frequency varies with the percentage of modulation of the carrier signal. If the output device 40 is a pair of head phones 40*b*, the audio modulations of the carrier will be heard in the phones 40*b*. A rectifier is not necessary to detect the audio modulations in the phones 40*b* because it appears that the average D.-C. component of the quenched oscillations provides detection without the conventional, rectifying detector. Because a great amount of current flows through the thyristor 12 in its high conductance mode of operation, the signal detected by the phones 40*b* is relatively loud in comparison to prior art semiconductor receivers using only one semiconductor device. The signal in the phones 40*b* may be amplified by additional stages of amplification in a manner well known in the art, if desired.

The thyristor receiver 10 may also be used for radio-control purposes. If the output device 40 is replaced with a frequency sensitive (reed) relay 40*c*, and the input signal to the inductor 62 is a tone modulated carrier signal (say, modulated at 1000 cycles per second, for example), a relatively weak, input signal can be translated into an output signal that will actuate the relay 40*c*. Because the thyristor 12 conducts heavily in its high conductance mode, current through the output network 30 is relatively high for a single semiconductor device. This feature of the thyristor receiver obviates the necessity for as many subsequent stages of amplification as are required by prior art circuits for similar purposes.

In another method of operation, the resistor 52 is adjusted so that the bias on the thyristor 12 is just below that necessary to provide oscillation in the circuit 10. The circuit 10 may be triggered into oscillation by an input signal of sufficient amplitude and of the frequency to which the tuning network 16 is tuned. The oscillations then increase to an amplitude that is sufficient to cause the thyristor 12 to switch to its high conductance state and to provide quenched oscillations of the type indicated by the repetitive waveforms 70 and 76, as shown in FIG. 2. If the output device 40 is a relay 40*a*, the switch 41 of the relay 40*a* will be closed upon a command input signal to the circuit 10. The switch 41 may be connected in a local "work" circuit to perform desired tasks in various manners well known in the art.

The circuit 10 may be operated in a so-called, "one-shot" method of operation. In this method of operation, the thyristor 12 is biased just below the point of oscillation, the capacitor 56 is removed from the circuit, and the resistance in the output network 30 is made sufficiently low so that the thyristor 12, once switched to its high conductance mode of operation, is supplied with sufficient current to maintain that mode. A relay 40*a* is connected in the output network as the output device. An input signal of the frequency of the tuned network 16 and of sufficiently high amplitude will trigger the circuit 10 into oscillations of an amplitude that will cause the thyristor to switch to its high conductance mode of operation. This action will actuate the relay 40*a* and close the switch 41. In the absence of the capacitor 56, once the relay 40*c* is actuated, the switch 41 will remain closed until current through the relay 40*c* is cut off manually.

A satisfactory thyristor receiver of the type described was constructed with components having the following values:

Resistor 50=5,100 ohms
Resistor 52=100,000 ohms (potentiometer)
Resistor 54=3,800 ohms
Resistor 26=430 ohms
Resistor 36=1,000 ohms
Resistor 38=10,000 ohms (potentiometer)
Capacitor 20=4–40 $\mu\mu$f.
Capacitor 22=51 $\mu\mu$f.
Capacitor 24=0.01 $\mu$f.
Capacitor 28=10 $\mu$f.
Capacitor 56=0.001 $\mu$f.
Capacitor 44=0.1 $\mu$f.
Inductor 18=9 turns of No. 12 copper wire, tapped 1¾ turns from the ground point
Inductor 34=10 turns of No. 12 copper wire
Inductor 62=9 turns of No. 16 copper wire The inductors 34 and 18 are bifilar wound to insure close coupling. The battery 48 is 6 volts.

From the foregoing description, it will be apparent that there has been provided a thyristor receiver of high sensitivity and relatively high output. While only one circuit with modifications therein has been described, other modifications coming within the spirit of this invention will, no doubt, readily suggest themselves to those skilled in the art. For example, while the oscillatory circuit described and illustrated is of the Armstrong regenerative type, it will be understood that other types of feedback circuits for producing oscillations may be used. Hence, it is desired that the foregoing be considered as illustrative, and not in a limiting sense.

What is claimed is:

1. A receiver comprising a semiconductor device having three electrodes and being adapted to operate, in a first mode of operation, as a transistor when the amplitude of current through one of said electrodes is below a critical amplitude, and in a second mode of operation as a high conductivity switch when the amplitude of current through said one electrode is above said critical amplitude, means connecting said device in a circuit providing regenerative feedback between two of said electrodes, means to apply a source of operating voltage to said circuit to cause current to flow in said circuit, said circuit comprising means to adjust said current over a range of amplitudes including said critical amplitude to control said feedback, said circuit comprising means including a resistor and a capacitor connected in a network to cause said device to change automatically to said first mode of operation after an increase in said current has caused said device to change from said first mode of operation to said second mode of operation, said capacitor being connected in parallel with said device and in series with said source of operating voltage through said resistor, whereby said capacitor may be charged by said source when said device is in said first mode of operation and may be discharged through said device when said device is in said second mode of operation, said resistor being connected to limit current through said device from said source, input signal means, means coupling said input signal means to said circuit, output signal means, and means connecting said output signal means in series with said one electrode.

2. A receiver comprising a semiconductor device having emitter, base, and collector electrodes and being adapted to operate, in a first mode of operation, as a transistor when the amplitude of current through said collector electrode is below a critical amplitude, and in a second mode of operation as a high conductivity switch when the amplitude of current through said collector electrode is above said critical amplitude, means connecting said device in a circuit providing positive feedback between said collector electrode and another of said electrodes, means to apply a source of operating voltage to said circuit to cause current to flow in said circuit, said circuit comprising means to adjust said current over a range of amplitudes including said critical amplitude to control said feedback, a resistor-capacitor network, said circuit also comprising means connecting said resistor-capacitor network in series with said source, said circuit further comprising means connecting the capacitor of said network between said emitter electrode and said collector electrode, said resistor of said network being connected between said capacitor and said source, whereby said capacitor may be charged by said source when said device is in said first mode of operation and discharged through said device when said device is in said second mode of operation, said resistor limiting current through said device from said source, input signal means, means coupling said input signal means to said base electrode in said circuit, output signal means, and means connecting said output signal means in series with said collector electrode.

3. A receiver comprising a semiconductor device having input, output, and common electrodes and being adapted to operate, in a first mode of operation, as a transistor when the amplitude of current through said output electrode is below a critical amplitude, and as a high conductivity switch in a second mode of operation when the amplitude of current through said output electrode is above said critical amplitude, an input network connected between said input and said common electrodes, an output network connected between said output and said common electrodes, said networks comprising regenerative feed-back means to feed back energy from said output network to said input network, said output network comprising means to apply a source of operating voltage between said common and said output electrodes, adjustable bias means connected between said operating voltage applying means and said input electrode to cause current to flow in said networks, said adjustable means comprising means to adjust said current over a range of amplitudes including said critical amplitude to control said feed-back energy, a resistor-capacitor network, said output network comprising means connecting said resistor-capacitor network in series with said source, said capacitor of said last-mentioned network being connected in series with said output and said common electrodes, said resistor of said resistor-capacitor network being connected between said capacitor and said operating voltage source, whereby said capacitor is charged through said resistor when said device is in said first mode of operation and discharged through said device when said device is in said second mode of operation, input signal means, means coupling said input signal means to said input network, output signal means, and means connecting said output signal means in said output network.

4. A circuit for translating a relatively weak input signal into a relatively strong output signal comprising a semiconductor device having input, output, and common electrodes, said device being adapted to operate either as a transistor or as a high conductivity switch, depending upon whether the amplitude of current through said output electrode is below or above a critical value, respectively, an input network comprising a tuned circuit, means connecting said input network between said input and common electrodes, an output network, means connecting said output network between said output and common electrodes, said output network being coupled to said input network to feed back energy to said input network when current flows in said networks to produce oscillations in said tuned circuit, means to apply a source of operating voltages to said networks to cause current to flow therein and to control said current over a range of amplitudes including said critical value, means to couple said input signal to said input network, said output network comprising output means adapted to be actuated by current in said output network resulting from the translation of said input signal by said circuit, a capacitor, means including a resistor connecting said capacitor to said source to charge said capacitor, and means connecting said capacitor between said common and output electrodes to discharge through said device when the fed-back energy causes current through said output electrode to exceed said critical value.

5. A circuit for translating a relatively weak input signal into a relatively strong output signal comprising a semiconductor device having input, output, and common electrodes, said device being adapted to operate either as a transistor or as a high conductivity switch, depending upon whether the amplitude of current through said output electrode is below or above a critical value, respectively, an input network comprising a tuned circuit, means connecting said input network between said input and common electrodes, an output network, means connecting said output network between said output and common electrodes, said output network being coupled to said input network to feed back energy to said input network when current flows in said networks to produce oscillations in said tuned circuit, means to apply a source of operating voltages to said networks to cause current to flow therein and to control said current over a range of amplitudes including said critical value, means to couple said input signal to said input network, said output network comprising output means adapted to be actuated by current in said output network resulting from the translation of said input signal by said circuit, a capacitor, said means to apply a source of operating voltages to said networks comprising resistor means forming a resistor-capacitor network with said capacitor, means connecting said capacitor between said common and output electrodes, and means connecting said resistor means in series with said output electrode and said source, whereby said capacitor is charged when said device operates as a transistor and said capacitor is discharged through said device when said device operates as a high conductivity switch.

6. A circuit for translating a relatively weak input signal into a relatively strong output signal comprising a semiconductor device having input, output, and common electrodes, said device being adapted to operate either as a transistor or as a high conductivity switch, depending upon whether the amplitude of current through said output electrode is below or above a critical value, respectively, an input network, means connecting said input network between said input and common electrodes, an output network being coupled to said input network to feed back energy to said input network when current flows in said networks, means to apply a source of operating voltages to said networks to cause current to flow therein and to control said current over a range of amplitudes including said critical value, means to couple said input signal to said input network, said output network comprising output means adapted to be actuated by current in said output network resulting from the translation of said input signal by said circuit, a capacitor, resistive means, means including said resistive means connecting said capacitor across said source of operating voltages, and means connecting said capacitor between said common and output electrodes, said input network comprising a tuning network, and said capacitor and said resistive means comprising means to quench periodically oscillations in said circuit when the fed-back energy causes current through said output electrode to exceed said critical value.

References Cited in the file of this patent

UNITED STATES PATENTS

| | | |
|---|---|---|
| 2,751,497 | Duncan | June 19, 1956 |
| 2,821,625 | Price | Jan. 28, 1958 |
| 2,889,499 | Rutz | June 2, 1959 |
| 2,922,032 | Haas et al. | Jan. 19, 1960 |
| 2,924,724 | Booker | Feb. 9, 1960 |
| 2,949,582 | Silliman | Aug. 16, 1960 |

OTHER REFERENCES

Prugh et al.: "Transistor Pulse Supply," Electronics, July 1954, page 188.

Prugh et al.: "Thyratron-Type Transistor Circuit," Electronics, page 190, August 1954.